United States Patent [19]
Jang et al.

[11] Patent Number: 5,640,354
[45] Date of Patent: Jun. 17, 1997

[54] DYNAMIC RANDOM ACCESS MEMORY HAVING SELF-TEST FUNCTION

[75] Inventors: Seong Jin Jang; Young-Hyun Jun; Jae Sik Lee, all of Seoul, Rep. of Korea

[73] Assignee: LG Semicon Co., Ltd., Cheongju, Rep. of Korea

[21] Appl. No.: 636,003

[22] Filed: Apr. 22, 1996

[30] Foreign Application Priority Data

Apr. 21, 1995 [KR] Rep. of Korea .................. 1995 9421

[51] Int. Cl.$^6$ ................................................. G11C 11/34
[52] U.S. Cl. ........................................ 365/201; 365/189.01
[58] Field of Search ......................... 365/189.01, 230.01, 365/207, 210, 201

[56] References Cited

U.S. PATENT DOCUMENTS 5,262,984  11/1993  Noguchi et al. .................... 365/189.01

Primary Examiner—Terrell W. Fears
Attorney, Agent, or Firm—Fleshner & Kim

[57] ABSTRACT

An improved DRAM having a self-test function capable of performing a self-test function in a fast page mode in accordance with a transition of a column address in accordance with an interior clock signal without a toggle of a column address strobe signal, which includes an entry/exit control unit for generating a self-test entry signal in accordance with a combination a predetermined address signal and an external synchronous signal; a signal transition detection unit for detecting a transition of a self-test entry signal and a word line enable signal and for outputting a transition detection signal; a counter for counting an interior clock signal outputted in accordance with a transition detection signal; a data generating and comparison unit for writing and reading a test data without a toggle of the external synchronous signal comparing the read test data with the generated test data; and an error and end detection unit for generating an error flag and end flag.

9 Claims, 6 Drawing Sheets

FIG. 3A RASB
CONVENTIONAL ART
FIG. 3B CASB
CONVENTIONAL ART
FIG. 3C WEB
CONVENTIONAL ART
FIG. 3D A0
CONVENTIONAL ART
FIG. 3E A1
CONVENTIONAL ART
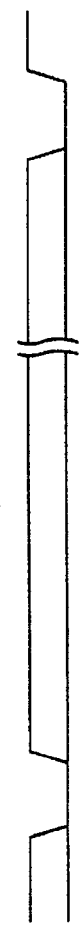
FIG. 3F WEB
CONVENTIONAL ART
FIG. 3G A0
CONVENTIONAL ART
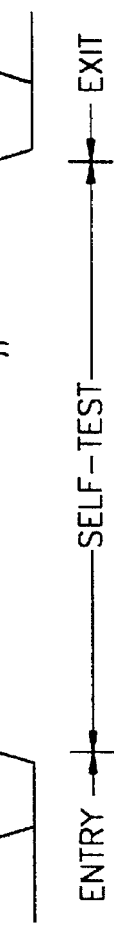
FIG. 3H A1
CONVENTIONAL ART

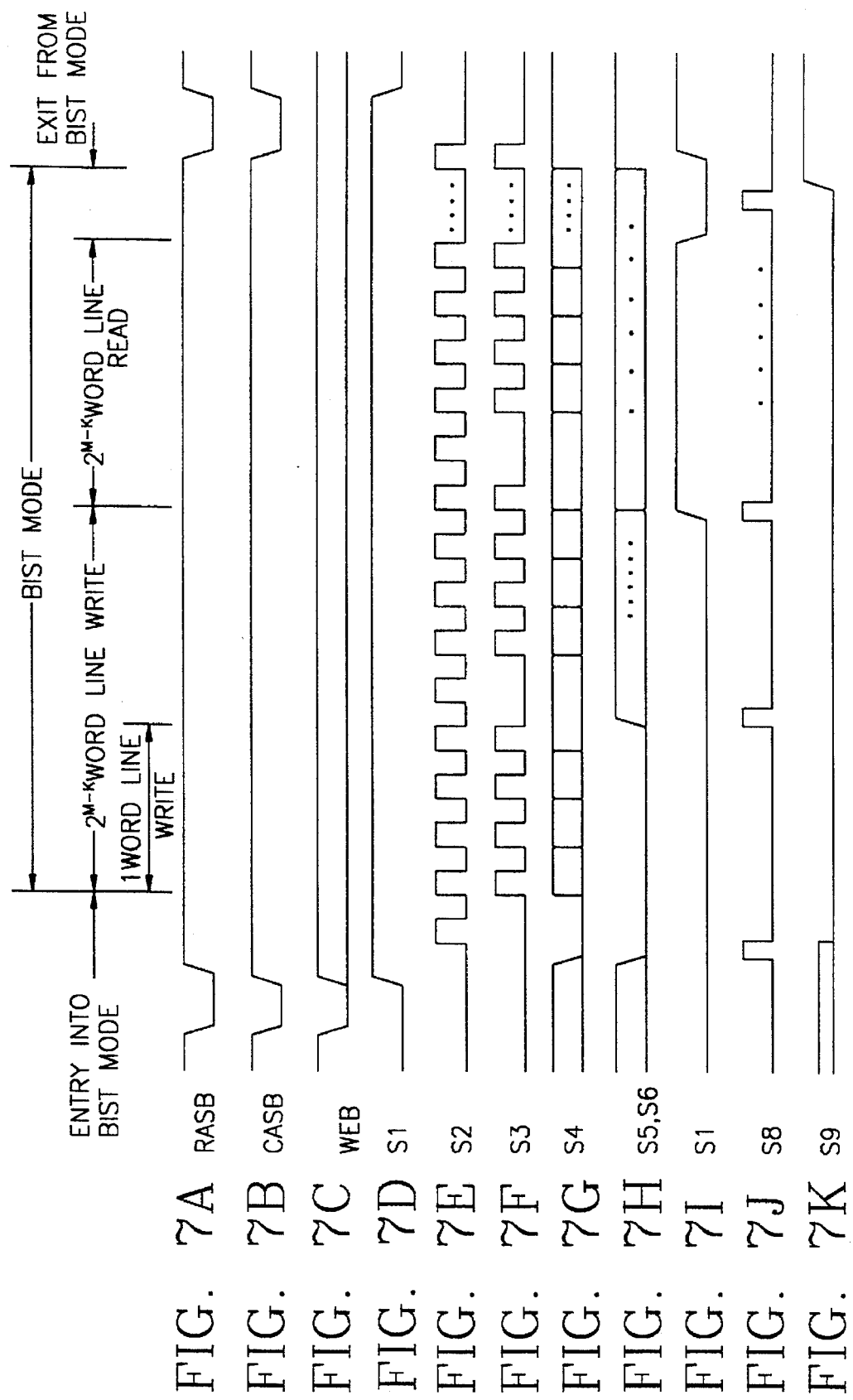

DYNAMIC RANDOM ACCESS MEMORY HAVING SELF-TEST FUNCTION

BACKGROUND OF THE INVENTION

1. Field of the Invention

The present invention relates to a dynamic random access memory (DRAM) having a self-test function, and particularly to an improved DRAM having a self-test function capable of performing a self-test function in the interior of a DRAM chip and reducing a test time of memory cells.

2. Description of the Conventional Art

Referring to FIG. 1, a conventional DRAM 100 having a self-test function includes a row address buffer 16, a row decoder 18, a column address buffer 20, a column decoder 22, a memory cell array 24, and a gate unit 26. In addition, there are further provided an entry/exit control unit 10, a clock generating unit 12, an address counter 14, a data generating unit 28, and a data comparison unit 30.

That is, the conventional DRAM 100 having a self-test function includes the entry/exit control unit 10 for entering a built-in self-test (hereinafter called BIST) mode so as to test a memory cell in accordance with an externally applied row address strobe signal RASB, column address strobe signal CASB, write enable signal WEB, and specific address signals A0 and A1 and for exiting from the BIST mode, the clock generating unit 12 for receiving a row address strobe signal RASB and a column address strobe signal CASB and for generating a predetermined interior clock signal, the row address counter 14 for counting an interior clock signal outputted from the clock generating unit 12 in accordance with a control of the entry/exit control unit 10 and for outputting column address count signals C0–C9, a read/write signal R/W, and a test pattern signal CBO, the row address buffer 16 for receiving row address count signals R0–R9 and a read/write signal R/W outputted from the address counter 14 in accordance with a control of an entry/exit control unit 10 and for buffering externally applied address signals A0–An, the row decoder 18 for decoding an output signal of the row address buffer 16, the column address buffer 20 for receiving column address count signals C0–C9 and a read/write signal R/W outputted from the address counter 14 in accordance with a control of the entry/exit control unit 10 and for buffering externally applied address signals A0–An, the column decoder 22 for decoding an output signal of the column address buffer 20, the memory cell array 24 including a plurality of memory cells which are selected by the column decoder 22 and the row decoder 18, the gate unit 26 having a plurality of gates for controlling an input/output of a data read/write from the memory cell array 24, the data generating unit 28 for outputting a test data having a check board pattern to the memory cell array 24 through the gate unit 26 in accordance with a read/write signal R/W and a test pattern signal CBO outputted from the address counter 14, and the data comparison unit 30 for comparing a test data outputted from the data generating unit 28 with a test data written on the memory cell array 24 and outputted through the gate unit 26 and for outputting an error flag.

As shown in FIG. 2, the address counter 14 includes a row address counter 14A for counting an interior clock signal outputted from the clock generating unit 12 and for generating row address count signals R0–R9, a column address counter 14B for counting a most significant bit (MSB) signal R9 of the row address counter 14A and for generating column address count signals C0–C9, a read/write counter 14C for counting a MSB signal C9 of the column address counter 14B and for generating a read/write signal R/W, and a check board counter 14D for counting a read/write signal R/W outputted from the read/write counter 14C and for generating a test pattern signal CB0.

The operation of the conventional DRAM having a self-test function will now be explained with reference to the accompanying drawings.

To begin with, referring to FIGS. 3A through 3C, a column address strobe signal CASB and a write enable signal WEB are enabled in accordance with a WCBR (WEB & CASB before RASB) mode before a row address strobe signal RASB is enabled.

Here, as shown in FIGS. 3D and 3E, when an address signal A0 of a high level and an address signal A1 of a low level are applied to the DRAM 100, and the DRAM 100 enters the BIST mode, and the entry/exit control unit 10 generates an entry signal.

When the DRAM 100 enters the BIST mode, the DRAM 100 is controlled in the CBR (CASB before RASB) mode. Referring to FIGS. 3C through 3E, when a write enable signal WEB becomes a high level, the address signals A0 and A1 become a "Don't care signals". Referring to FIGS. 3F through 3H, when address signal A0 and A1 become a high level, the write enable signal WEB becomes a Don't care state. During the BIST mode, the data output driver is not in operational.

In addition, the clock generating unit 12 receives a row address strobe signal RASB and a column address strobe signal CASB, and outputs a predetermined interior clock signal to the address counter 14.

The address counter 14 generates a read/write signal R/W, a test pattern signal CBO, row address count signals R0–R9, and column address count signals C0–C9, and the data generating unit 28 writes a test data in a write cycle of a self-test cycle on all cells of the memory cell array 24 in accordance with the row decoder 18 and the column decoder 22.

Thereafter, the data comparison unit 30 reads a test data stored in the memory cell array 24 in a read cycle of a self-test cycle, and detects an error by comparing a read test data with a test data outputted from the data generating unit 28. When an error occurs, the data generating unit 28 outputs an error flag to the outside, and the thusly outputted error flag is maintained until the BIST mode is finished.

In addition, the data generating unit 28 generates a test data having a pattern opposed to the test data. Thereafter, read/write and comparison process are performed.

In a DRAM of 4M and a parallel test of 16 bits, the test data can be written and read in cycles of 256K, and the BIST mode is completed in cycles of 256K.

As shown in FIGS. 3A through 3H, the column address counter 14B is connected to the row address counter 14A which is used in the CBR mode or a hidden refresh mode. So, a self-test is performed in a row fast-scan method, and the read/write counter 14C and the check board counter 14D are sequentially connected to the column address counter 14B.

Meanwhile, as shown in FIGS. 3D through 3H, when address signals A0 and A1 of a low level are outputted to the DRAM 100, the DRAM 100 exits from the BIST mode, and the BIST mode is completed when the entry/exit control unit 10 generates an exit signal.

As shown in FIG. 4, when the DRAM 100 is 4M bits, the check board 200 tests 32M bytes, and an error flag which occurs by each DRAM 100 is outputted to the outside through an output pin Dout of the check board 200.

The conventional DRAM having a self-test function has better features such as an easy maintenance of the system and a start-up function test. However, since a CBR mode is necessary so as to perform a test function, a toggle of row and column address strobe signals is additionally necessary.

In addition, the conventional DRAM having a self-test function has a disadvantages in that since a self-test function is performed by writing the test data on all memory cells of the DRAM and comparing the written test data with a predetermined data, memory cells should be refreshed during a self-test operation. In order to overcome the above-mentioned problems, when the self-test function is performed in the CBR mode of the row fast-scan method, it takes long time compared to the self-test function which is performed in the fast page mode.

Furthermore, since the conventional DRAM having a self-test function does not generate an end flag after the end of the BIST mode, the end of the BIST mode should be recognized from a counter of the external DRAM.

SUMMARY OF THE INVENTION

Accordingly, it is an object of the present invention to provide a DRAM having a self-test function which overcome the problems encountered in a conventional DRAM having a self-test function.

It is another object of the present invention to provide a DRAM having a self-test function capable of performing a self-test function in a fast page mode in accordance with a transition of a column address in accordance with an interior clock signal without a toggle of a column address strobe signal when an interior row control signal is generated when a self-test entry signal is applied in accordance with a combination of external signals.

To achieve the above objects, there is provided a DRAM having a self-test function, which includes an entry/exit control unit for generating a self-test entry signal in accordance with a combination a predetermined address signal and an external synchronous signal; a clock generating unit for generating an interior clock signal of a predetermined cycle in accordance with a self-test entry signal; a signal transition detection unit for detecting a transition of a self-test entry signal and a word line enable signal and for outputting a transition detection signal; a counter for counting an interior clock signal outputted from the clock generating unit in accordance with a transition detection signal and for outputting a row address signal, a column address signal, and a test end signal; a data generating and comparison unit for writing a test data in memory cells, which is generated in accordance with a predetermined bit signal outputted from the counter without a toggle of an external synchronous signal, reading a test data stored in the memory cells, comparing the read test data with the generated test data, and outputting an error signal; and an error and end detection unit for generating an error flag and end flag in response to an error signal and a test end signal outputted from the counter.

BRIEF DESCRIPTION OF THE DRAWINGS

FIGS. 3A through 3H are timing diagrams of a signal applied to an entry/exit control unit of FIG. 1;

FIGS. 7A through 7K are timing diagrams of a signal inputted to/outputted from each element of FIG. 5 according to the present invention.

DETAILED DESCRIPTION OF THE INVENTION

Figure 1:
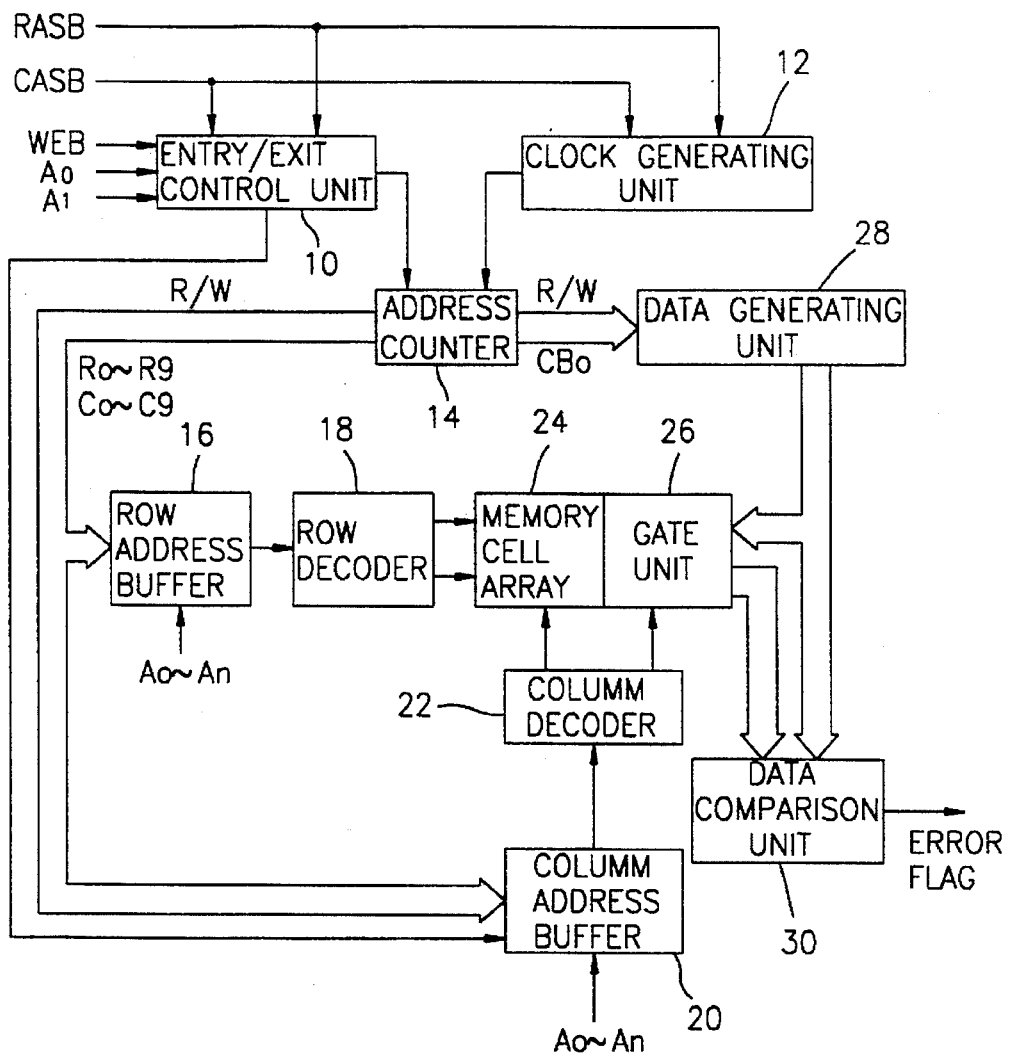
FIG. 1 is a block diagram of a conventional DRAM having a self-test function.
Figure 2:
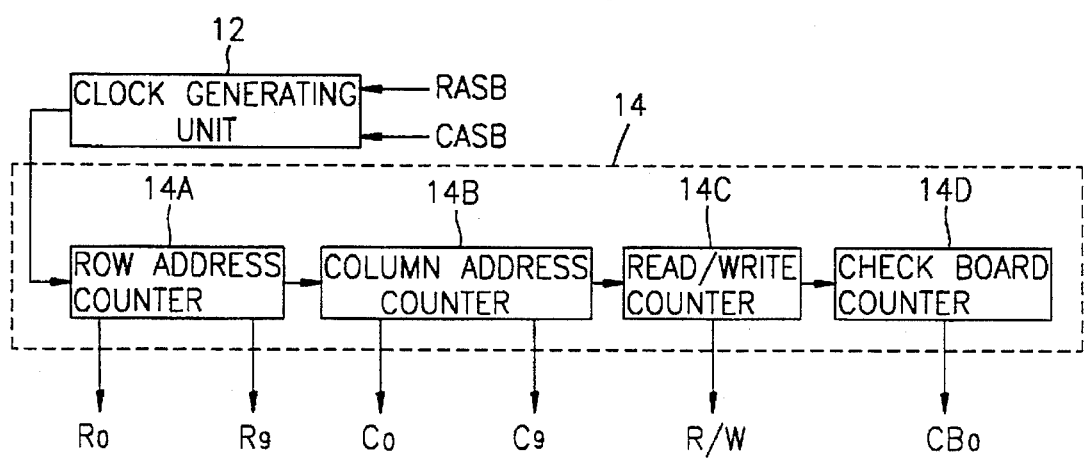
FIG. 2 is a detailed clock diagram of an address counter of FIG. 1.
Figure 4:
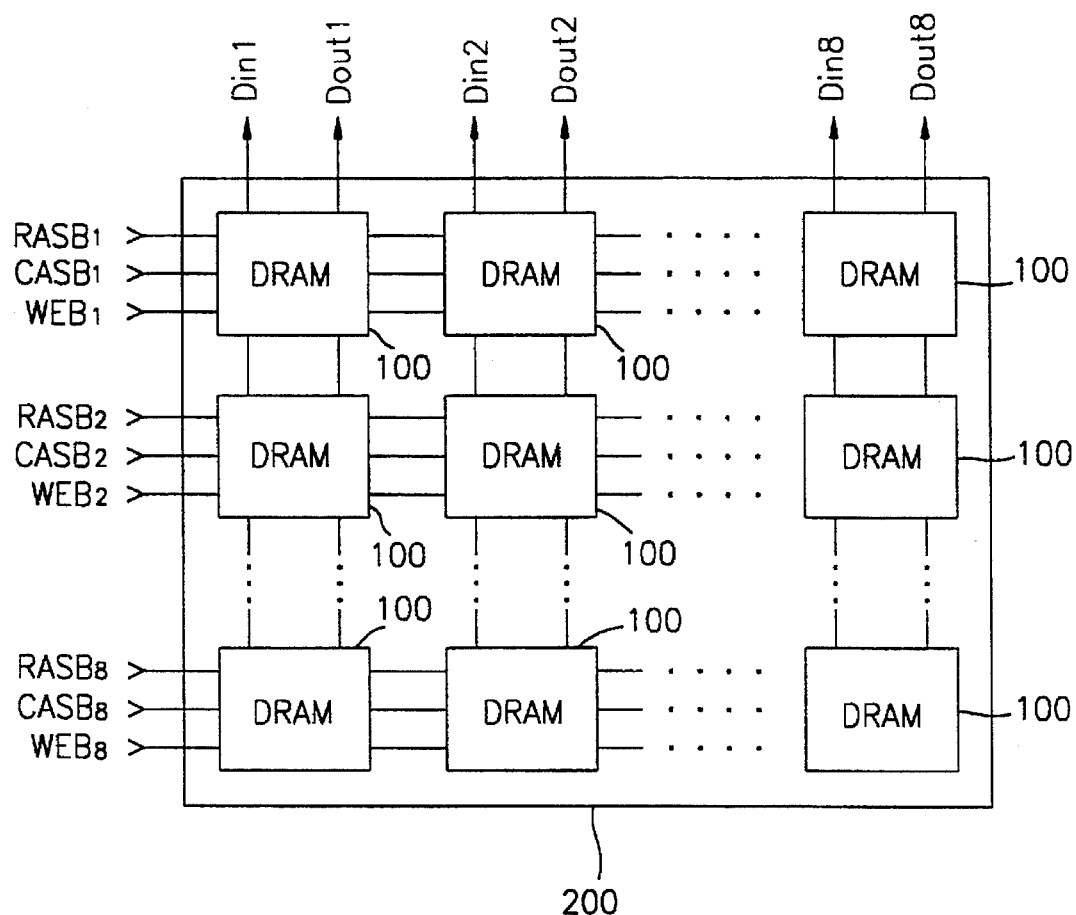
FIG. 4 is a block diagram of a check board of 32M bytes used for testing a DRAM chip of FIG. 1.
Figure 5:
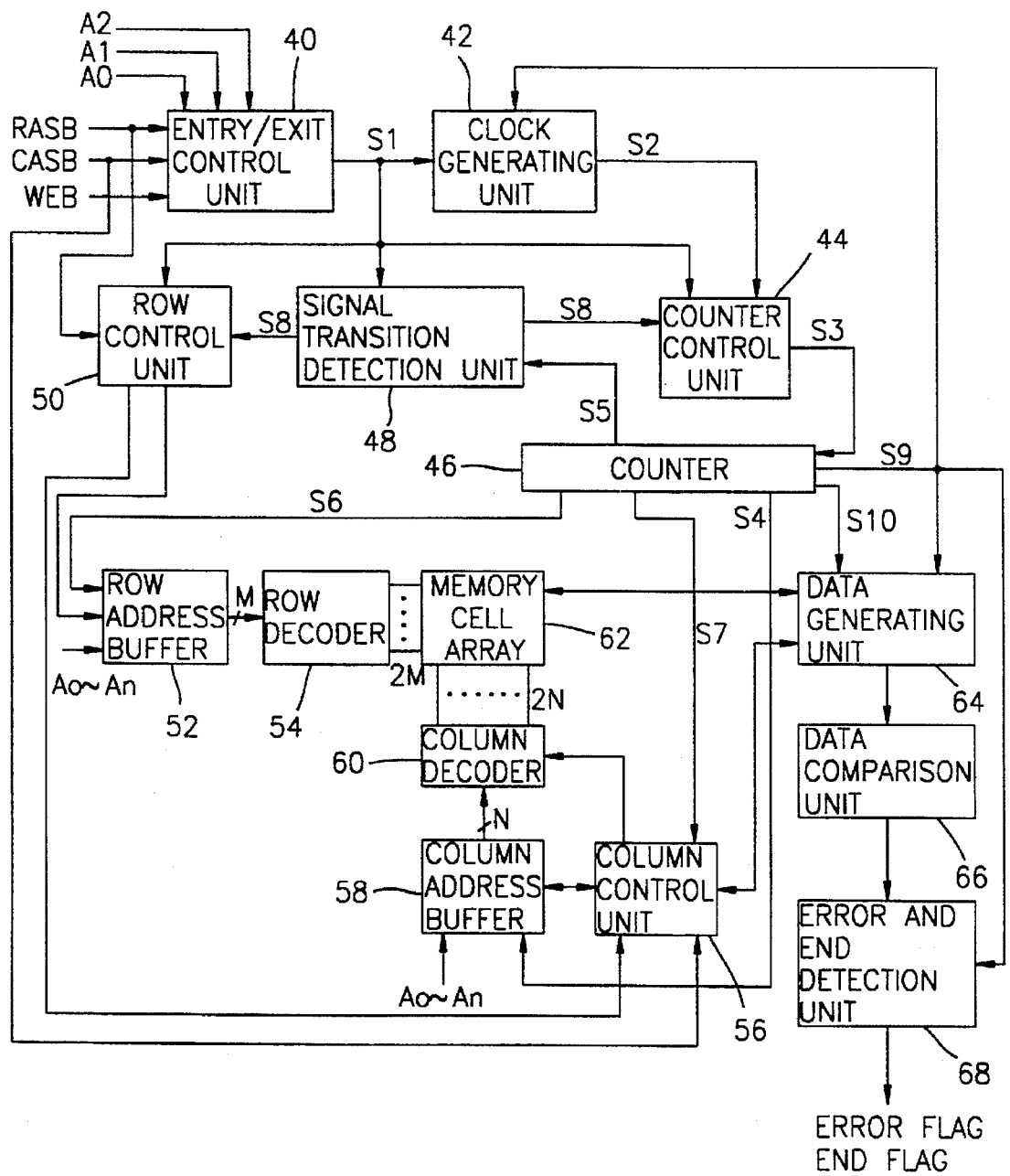
FIG. 5 is a block diagram of a DRAM having a self-test function according to the present invention.

Referring to FIG. 5, a DRAM having a self-test function according to the present invention includes a row address buffer 52, a row decoder 54, a column address buffer 58, a column decoder 60, and a memory cell array 62. In addition, there are further provided an entry/exit control unit 40 for entering the BIST mode or for existing from the BIST mode in accordance with a combination of externally applied row and column address strobe signals RASB and CASB, a write enable signal WEB, and specific address signals A0, A1, and A2, a clock generating unit 42 for generating an interior clock signal S2 of a predetermined cycle in accordance with a self-test entry signal S1 outputted from the entry/exit control unit 40, a counter control unit 44 for blocking an interior clock signal S2 outputted from the clock generating unit 42 and for outputting an interior signal S3 for a predetermined time after a test data is written in a specific cell of the memory cell array 62 and is read therefrom, a counter 46 for counting an interior clock signal S3 outputted from the counter control unit 44, outputting a column address signal S4 to a column address buffer 58, outputting a row address signal S6 to a row address buffer 52, outputting a test end signal S9 to the clock generating unit 42, and generating a test pattern signal S10 having a predetermined pattern, a word line enable signal S5, and a read/write signal S7, a signal transition detection unit 48 for detecting a word line enable signal S5 outputted from the counter 46 or a transition of a self-test entry signal S1 outputted from the entry/exit control unit 40, and for outputting a transition detection signal S8 to the counter control unit 44, a row control unit 50 for outputting an interior row control signal to the row address buffer 52 in accordance with a transition detection signal S8 outputted from the signal transition detection unit 40, a self-test entry signal S1 outputted from the entry/exit control unit 40, and a row address strobe signal RASB, a column control unit 56 for controlling the column address buffer 58 and the column decoder 60 in accordance with an interior row control signal outputted from the row control unit 50, a read/write signal S7 outputted from the counter 46, and a column address strobe signal CASB, a data generating unit 64 for generating a test data in accordance with a test pattern signal S10 outputted from the counter 46, writing a generated test data in the memory cell array 62 in accordance with a control of the column control unit 56, and reading a test data stored in the memory cell array 62, a data comparison unit 66 for comparing the test data outputted from the test pattern signal with a test data read from the data generating unit 64, and an error and end detection unit 68 for outputting an error flag or an end flag to the outside in accordance with an error signal outputted from the data comparison unit 66 and a test end signal S9 outputted from the counter 46.

Figure 6:
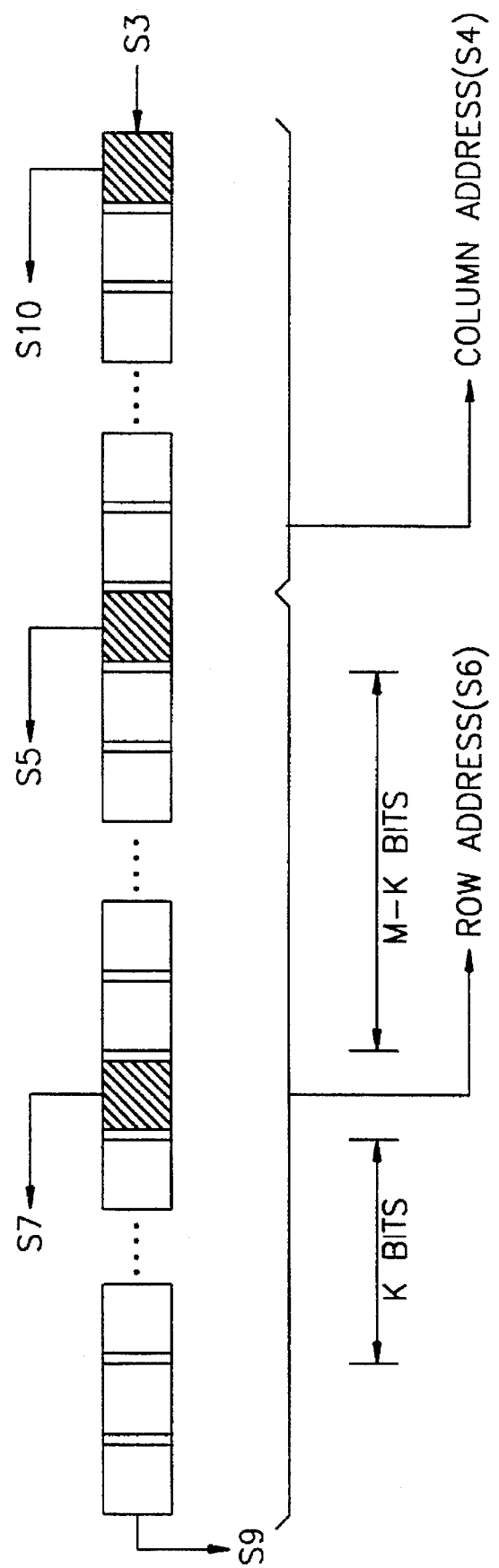
FIG. 6 is a detailed block diagram of a counter of FIG. 5 according to the present invention.

As shown in FIG. 6, the counter 46 includes a plurality of bit blocks for counting an interior clock signal S3 outputted from the counter control unit 44 and for sequentially outputting a column address signal S4, a row address signal S6, and a test end signal S9. Here, these bit blocks may be composed of flip-flops. In addition, the test pattern signal S10 is referred to the least significant bit (LSB) signal of the column address signal S4, and the word line enable signal S5 is referred to the LSB of the row address signal S4, and the read/write signal S5 is referred to a specific bit signal of the row address signal S6. In addition, the MSBs of the row address signal S6 may be additionally used for determining the pattern of the test data.

The operation and effects of the DRAM having a self-test function according to the present invention will now be explained with reference to the accompanying drawings.

To begin with, when in the WCBR mode, address signals A0 and A2 of a high level and an address signal A1 of a low level are inputted to the entry/exit control unit 40, the entry/exit control unit 40, as shown in FIG. 7D, outputs a self-test entry signal S1 of a high level to the clock generating unit 42 and the signal transition detection unit 48, respectively. Thereafter, the BIST mode begins, and when the self-test signal S1 is transited to a high level, all bits of the counter 46 become a low level in accordance with a control of the counter control unit 44.

While the self-test entry signal S1 is a high level, the clock generating unit 42, as shown in FIG. 7E, generates an interior clock signal S2 of a predetermined cycle and outputs to the counter control unit 44.

The signal transition detection unit 48 detects a self-test entry signal S1 or a transition of the word line enable signal S5 as shown in FIG. 7H, and outputs a transition detection signal S8 as shown in FIG. 7J to the counter control unit 46 and the row control unit 50, respectively.

When the transition detection signal S8 is inputted, the counter control unit 44 blocks the interior clock signal S2 outputted from the clock generating unit 42 from being inputted to the counter unit 46 for a predetermined time, and outputs the interior clock signal S3 as shown in FIG. 7F to the counter 46. That is, the counter control unit 44 blocks an interior clock signal S2 outputted from the clock generating unit 42 from being inputted to the counter unit 46 for a predetermined time until a predetermined word line is enabled in accordance with an interior row control signal generated by the row control unit 50 in accordance with a transition detection signal S8, and a data is once read from and written in a memory cell selected in accordance with the column address signal S4 outputted from the counter unit 46.

Thereafter, the counter unit 46 counts the interior clock signal S3 outputted from the counter control unit 44, outputs the column address signal S4 to the column address buffer 58 after increasing the same.

The data generating unit 64 generates a test data having a predetermined pattern in accordance with a test pattern signal S10 which is the least significant bit signal of the column address signal S4, and the thusly generated test data is written in a memory cell selected in accordance with a column address signal S4.

Here, the test data can be written in a memory cell in accordance with a column address signal S4 irrespective of a change of an interior row control signal outputted from the row control unit 50.

As mentioned above, since the data can be written without a toggle of externally applied row and column address signals RASB and CASB, a data writing time of data can be reduced as compared to that in a conventional fast page mode.

When the test data is written in all cells which are allocated to an enabled word line, the word line enable signal S5 of the most significant bit signal of the row address signal S6 is transited, so that the test data can be written in the memory cell allocated to a new word line. Here, the test data is written in a memory cell allocated to a $2^{(M-K)}$ number of word lines. That is, the value of "M-K" is determined so that a $2^{(M-K)}$ number of word lines can be operated within a refresh time of the memory cell.

Thereafter, the read/write signal S7 of a predetermined bit signal of the row address signal S6 is transited to a high level as shown in FIG. 7I and outputted to the column control unit 56, and the read mode is converted into the write mode.

Therefore, the test data stored in the memory cells is read, and compared with the test data outputted from the data generating unit 64 by the data comparison unit 66. When the read data and test data outputted from the data generating unit 64 are different from each other, the data comparison unit 66 outputs an error signal to the error and end detection unit 68.

A $2^k$ number of word lines are sequentially enabled, and the test data is written in the memory cell in the above-mentioned process, and the processes of reading the test data and of the data comparison are performed.

After the memory cells allocated to a $2^M$ number of word lines are tested, the BIST mode is performed at a test data of another pattern. The pattern of the test data is determined by the LSB S10 of the counter 46 as well as by the MSBs of the counter 46. At this time, the pattern of the test data may be implemented by a low level, a high level, a check board, a reverse check board.

When all bit signals of the counter 46 become a high level, the counter 46 outputs a test end signal S9, as shown in FIG. 7K, to the clock generating unit 42, the data generating unit 64, and the error and end detection unit 68, respectively, and ends the BIST mode. In addition, the entry/exit control unit 40 may control an "Exit" operation from the BIST mode by generating an exit signal in accordance with a CBR mode or a ROR (RASB only refresh) mode.

The error and end detection unit 68 generates an error flag when receiving an error signal from the data comparison unit 66 and generates an end flag when receiving a test end signal S9 from the counter 46. The error flag and end flag are outputted to the outside through output terminals DQ0 and DQ1 of an output buffer (not shown). In addition, in case of the DRAM of "x1", that is, when an output is one bit, the error flag and end flag are outputted to the outside through terminals Din and Dout.

As described above, the DRAM having a self-test function according to the present invention is directed to performing the BIST mode in accordance with a count signal outputted from the counter unit without a toggle of externally applied row and column address strobe signals, so that it is possible to reduce a test time in half as compared to a conventional fast page mode method. In addition, since the present invention is directed to generating an end flag after completing the BIST mode, a self-test function can be more easily performed. In addition, since a read/write operation is performed based on a refresh cycle of a memory cell, it is possible to check a weakness of a refresh time.

Although the preferred embodiments of the present invention have been disclosed for illustrative purposes, those skilled in the art will appreciate that various modifications, additions and substitutions are possible, without departing from the scope and spirit of the invention as described in the accompanying claims.

What is claimed is:

1. A dynamic random access memory having a self-test function comprising:

an entry/exit control unit for generating a self-test entry signal in accordance with a combination of predetermined address signals and external synchronous signals;

a clock generating unit for generating an interior clock signal of a predetermined cycle in accordance with said self-test entry signal;

a signal transition detection unit for detecting a transition of the self-test entry signal and a word line enable signal and for outputting a transition detection signal;

counter for counting said interior clock signal outputted from said clock generating unit in accordance with a transition detection signal and for outputting a row address signal, a column address signal, and a test end signal;

a data generating and comparison unit for writing a test data in memory cells generated in accordance with a predetermined bit signal outputted from said counter, reading a test data stored in said memory cells, comparing a test data read from the memory cells with said test data generated, and outputting an error signal, wherein said writing and reading operation is performed without a toggle of said external synchronous signals; and a detection unit for generating an error flag and end flag in response to an error signal and a test end signal outputted from the counter.

2. The dynamic random access memory of claim 1, wherein said counter includes a plurality of sequentially connected bit blocks for inputting and counting said interior clock signal and for outputting a column address signal, a row address signal, and a test end signal, wherein a least significant bit signal of said column address signal is used to determine a pattern of a test data, and the least significant bit signal of said row address signal is applied to the signal transition detection unit.

3. The dynamic random access memory of claim 1, wherein said memory further includes a counter control unit for receiving a self-test entry signal from the entry/exit control unit, initializing all bit signals outputted from the counter to a predetermined level, and blocking an interior clock signal from being inputted to the counter for a predetermined time when receiving a transition detection signal from the signal transition detection unit.

4. The dynamic random access memory of claim 1, wherein said counter is directed to outputting a predetermined bit signal among the row address signals to the column control unit as a read/write signal.

5. The dynamic random access memory of claim 4, wherein said counter is directed to generating a read/write signal so that a predetermined number of word lines can be driven, and a data comparison can be made possible within a predetermined refresh time of a memory cell.

6. The dynamic random access memory of claim 1, wherein said counter is directed to outputting a test end signal to the detection unit when all bit signals are a high level.

7. The dynamic random access memory of claim 1, wherein said data generating and comparison unit is directed to performing a read/write operation in accordance with a transition of a column address signal in a state that an interior row control signal outputted from the row control unit in accordance with a transition detection signal of the signal transition detection unit is not transited.

8. The dynamic random access memory of claim 1, wherein a self-test entry signal outputted from said entry/exit control unit is generated in combination with an external synchronous signal of a WCBR mode and a predetermined address signal.

9. The dynamic random access memory of claim 1, wherein said counter is directed to additionally using a predetermined bit signal of the most significant bit so as to determine a pattern of the test data.

* * * * *